United States Patent
Ito (10) Patent No.: US 7,544,065 B2
(45) Date of Patent: Jun. 9, 2009

(54) ELECTRICAL JUNCTION BOX FOR MOTOR VEHICLE

(75) Inventor: Katsuya Ito, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 12/010,713

(22) Filed: Jan. 29, 2008

(65) Prior Publication Data

US 2008/0254654 A1    Oct. 16, 2008

(30) Foreign Application Priority Data

Feb. 1, 2007    (JP) ............................. 2007-023179

(51) Int. Cl.
*H01R 12/00*    (2006.01)
(52) U.S. Cl. .................................................. 439/76.2
(58) Field of Classification Search ............... 439/76.2, 439/34; 713/186; 361/752, 767, 624; 257/79
See application file for complete search history.

(56) References Cited

U.S. PATENT DOCUMENTS

| | | | |
|---|---|---|---|
| 6,493,234 B2 * | 12/2002 | Sunami et al. ............... | 361/752 |
| 6,992,331 B2 * | 1/2006 | Hon et al. ..................... | 257/79 |
| 2001/0014014 A1 | 8/2001 | Hiramatsu | |
| 2001/0039131 A1 * | 11/2001 | Murakami et al. ......... | 439/76.2 |
| 2003/0022536 A1 * | 1/2003 | Saito et al. ................. | 439/76.2 |

FOREIGN PATENT DOCUMENTS

| JP | A-2001-230555 | 8/2001 |
|---|---|---|
| JP | A-2001-309524 | 11/2001 |

* cited by examiner

*Primary Examiner*—Alexandr Gilman
(74) *Attorney, Agent, or Firm*—Oliff & Berridge, PLC (57) ABSTRACT

An electrical junction box includes a printed board, a broad bus bar for a power source circuit, a plurality of output side connecting terminal members, and a casing for containing the printed board, broad bus bar, and terminal members. A plurality of fuses are mounted on fuse-containing sections in parallel with one another. The broad bus bar for a power source circuit has a vertical portion and a horizontal portion extending from an upper end of the vertical portion to form an inverted L-shaped configuration. The output side connecting terminal members are disposed in a space covered with the broad bus bar. The broad bus bar is provided with a window so that a soldered condition of the output side connecting terminal members can be seen through the window.

6 Claims, 5 Drawing Sheets

ELECTRICAL JUNCTION BOX FOR MOTOR VEHICLE

This application claims priority from Japanese Patent Application No. 2007-023179 filed in the Japanese Patent Office on Feb. 1, 2007, the disclosure of which is incorporated herein by reference in its entirety.

BACKGROUND

This invention relates to an electrical junction box for a motor vehicle and more particularly relates to an electrical junction box for a motor vehicle that allows a person to see soldered portions between an internal circuit member and a printed board. Such visibility enhances reliability in soldered connections even if the soldered portions are covered with a bus bar.

Generally, a number of relays and fuses are mounted on an electrical junction box that distributes a power source to electrical devices mounted on a motor vehicle, such as an automobile. The relays and fuses are connected through connecting terminals to a printed board. The connecting terminals are soldered to the printed board. A condition of the soldered portions has been usually confirmed by a visual inspection.

However, because electrical and electronic parts are mounted on the printed board in a high density, there is a possibility that the soldered portions are covered with the bus bar or other members. In this case, it is difficult to carry out the visual inspection of the soldered portions between the printed board and the connecting terminals. Consequently, there is a possibility that a failure in the soldered portions may be overlooked. This may lower reliability in soldered connections.

Although there may be a method for inspecting a soldered condition by using an inspecting device, the inspecting method requires inspecting equipment and additional working steps. This will induce a high cost in production.

Figure 5:
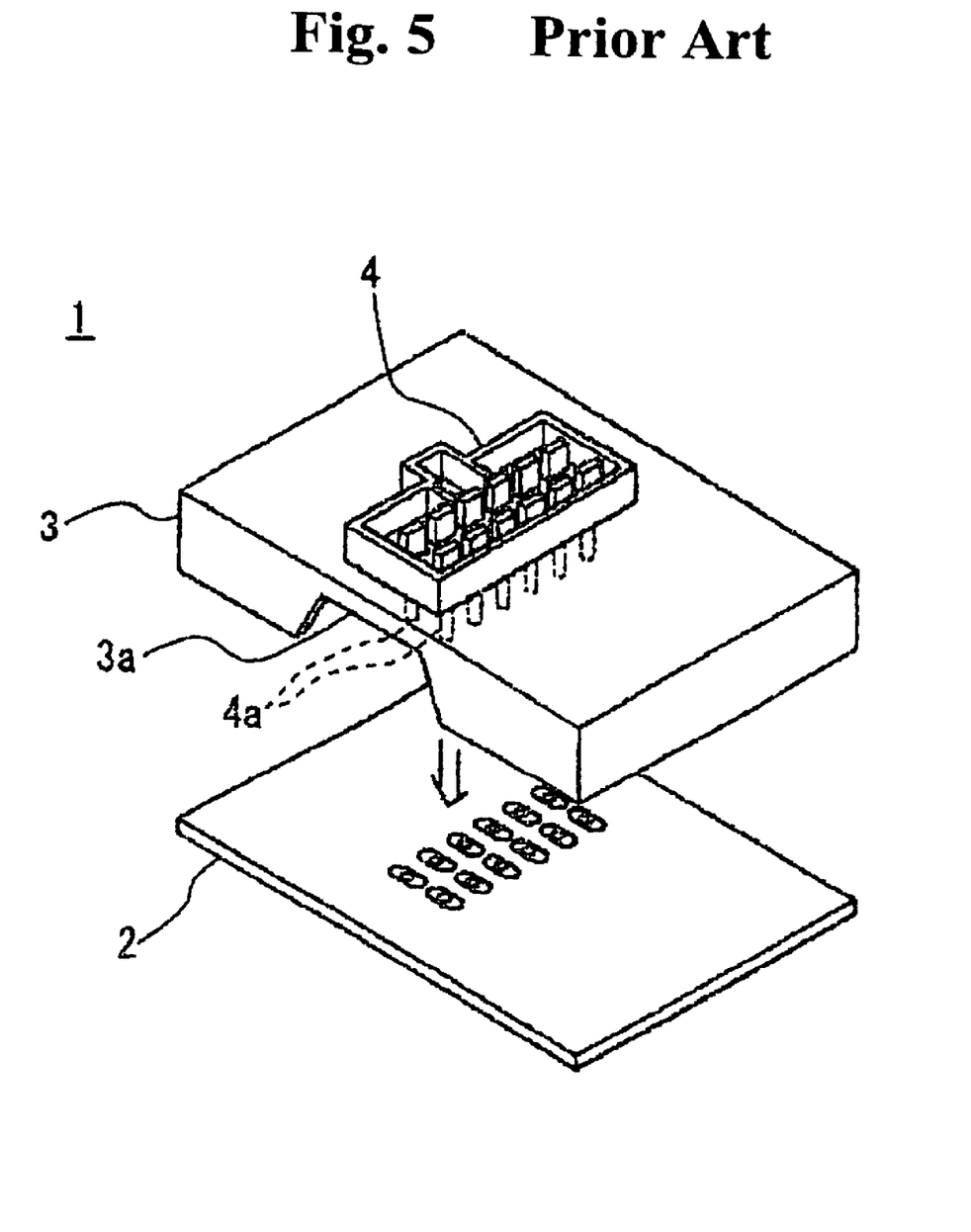
FIG. 5 is an exploded perspective view of a prior art casing for an electronic unit.

FIG. 5 shows an example of a casing 1 for an electronic unit disclosed in JP 2001-230555A. The casing 1 for an electronic unit includes a printed board 2 and a casing member 3 for covering the printed board 2. Connecting terminals 4a are disposed in a connector housing 4 of the casing member 3 to project toward the printed board 2. The casing member 3 covers the printed board 2 and the connecting terminals 4a are soldered to the printed board 2. The casing member 3, which contains the printed board 2, has a side wall with a window 3a so that soldered portions between the printed board 2 and the connecting terminals 4a of the connector housing 4 in the casing member 3 can be seen from the outside.

SUMMARY

However, when the soldered portions between the printed board and the connecting terminals are covered with bus bar and other internal circuit members, it is difficult to carry out the visual inspection of the soldered portions. Accordingly, a better way is needed to ensure a reliable soldered connection between the printed board and the connecting terminals.

In view of the above problems, an object of exemplary embodiments of the present invention is to provide an electrical junction box for a motor vehicle that can make soldered portions visible and enhance reliability in soldered connections by improving a shape of a bus bar, even if a printed board and terminals to be connected to the printed board are covered with the bus bar.

In order to overcome the above problems, an exemplary embodiment of the present invention provides an electrical junction box for a motor vehicle including a printed board, a broad bus bar for a power source circuit, a plurality of output side connecting terminal members, and a casing for containing the printed board, broad bus bar, and terminal members. Fuse-containing sections are disposed on a side of the casing in a direction perpendicular to the printed board. A plurality of fuses are mounted on the fuse-containing sections in parallel with one another. An input terminal of each fuse is disposed on an upper side and an output terminal of each fuse is disposed on a lower side. The broad bus bar for a power source circuit has a vertical portion and a horizontal portion extending from an upper end of the vertical portion to form an inverted L-shaped configuration. The vertical portion is supported on the printed board at a lower end, and the horizontal portion is provided on a distal end with a plurality of branched input side connecting terminal portions to be connected to the input terminals of the fuses. The output side connecting terminal members are disposed in a space covered with the broad bus bar, and are connected to output terminals of the fuses. The output side connecting terminal members are soldered to conductors of the printed board at lower ends of the members. The broad bus bar is provided with a window so that a soldered condition of the output side connecting terminal members can be seen through the window.

In the electrical junction box for a motor vehicle constructed above, because the window is provided in the broad bus bar, it is possible to see the connected condition of the soldered portions between the printed board and the output side connecting terminal members, even if the output side connecting terminal members soldered to the printed board are covered with the broad bus bar. As a result, the electrical junction box is not shipped without detecting a failure in the soldered output side connecting terminal members. This will enhance reliability in the soldered connections. Also, because a step of inspecting the soldered connection by using an inspection device is eliminated, inspection equipment is not required and the number of working steps can be reduced, thereby reducing production costs.

Preferably, the broad bus bar is provided with a plurality of windows that extend from the vertical portion of the broad bus bar to the horizontal portion and are spaced away from one another in a longitudinal direction.

According to the above structure, it is possible to widen a visual area of the soldered portions on the output side connecting terminal members connected to the printed board. Thus, it is possible to reliably detect a failure in the soldered connection between the printed board and the output side connecting terminal members and to decrease failed conditions.

As described above, according to exemplary embodiments of the present invention, because the window is provided in the broad bus bar, it is possible to see the connected condition of the soldered portions between the printed board and the output side connecting terminal members, even if the output side connecting terminal members soldered to the printed board are covered with the broad bus bar. Therefore, the electrical junction box is not shipped without detecting a failure in the soldered output side connecting terminal members. This will enhance reliability in the soldered connections. Also, because a step of inspecting the soldered connection by using an inspection device is eliminated, inspection equipment is not required and the number of working steps can be reduced, thereby reducing production costs.

Also, because the broad bus bar is provided with a plurality of windows that extend from the vertical portion of the broad bus bar to the horizontal portion and are spaced away from one another in a longitudinal direction, it is possible to widen a visual area of the soldered portions on the output side connecting terminal members connected to the printed board. Thus, it is possible to reliably detect a failure in the soldered connection between the printed board and the output side connecting terminal members and to decrease failed conditions.

BRIEF DESCRIPTION OF THE DRAWINGS

Exemplary embodiments of the invention will be described below with reference to the drawings, in which like numerals represent like parts, and in which.

DETAILED DESCRIPTION

FIGS. 1 to 4 shown an embodiment of an exemplary electrical junction box 10 for a motor vehicle. The electrical junction box 10 includes a casing having a first casing member 11 and a second casing member 12, a fuse module 20, a relay module 30, a printed board (circuit board) 40, and an ECU 13. The modules 20 and 30 act as heat generation members, and are disposed on an inner side of the casing in a vertical direction. The printed board 40 is disposed on the opposite inner side of the casing in a horizontal direction. The ECU 13 is disposed on a bottom wall of the second casing member 12.

Figure 1:
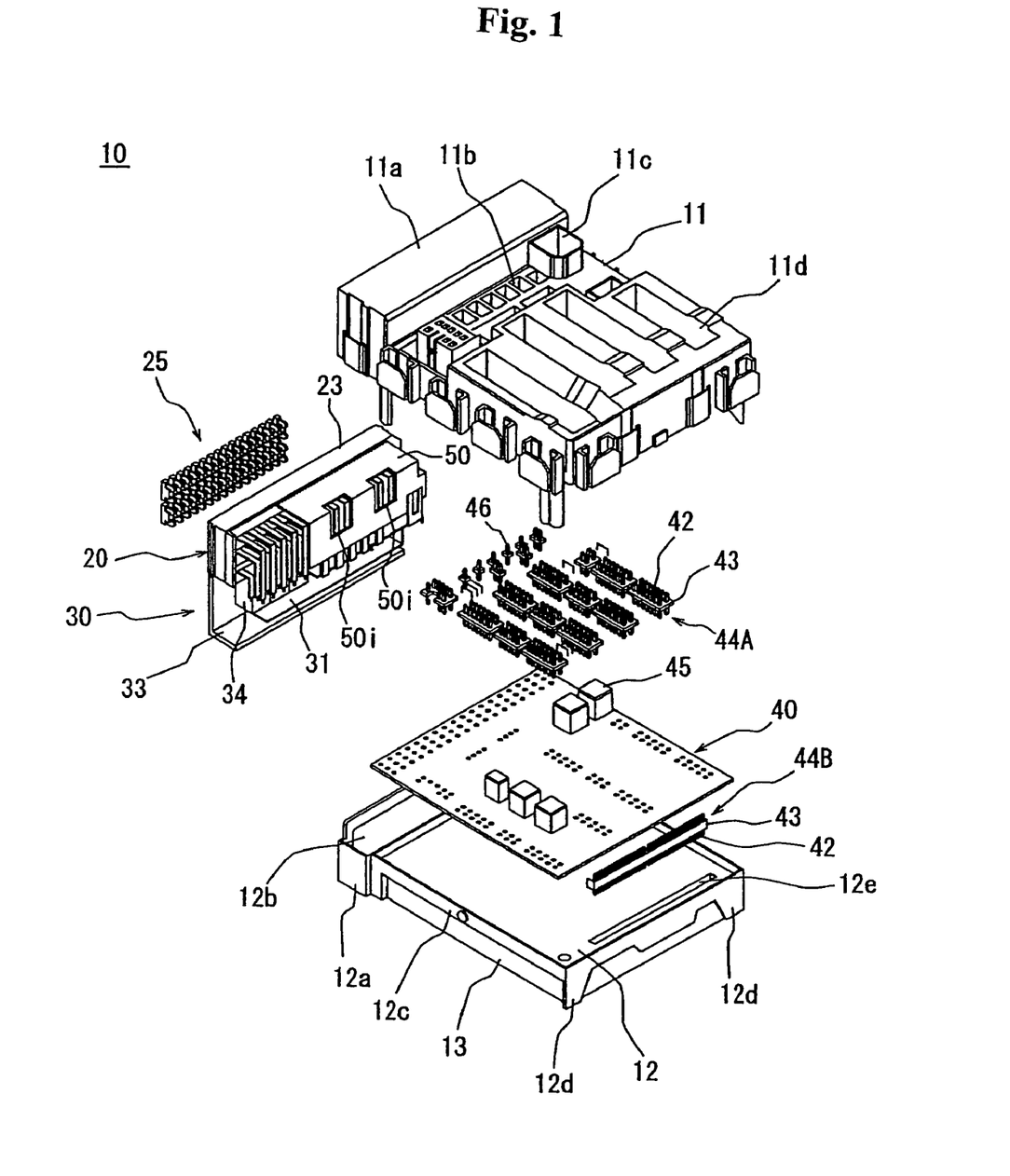
FIG. 1 is an exploded perspective view of an embodiment of an electrical junction box for a motor vehicle.

As shown in FIG. 1, a fuse module mounting section 11a is provided in a side wall of the first casing member 11 with a side opening (not shown) and extends upward from a side wall of the first casing member 11. A relay module mounting section 12a is provided in a side wall with a side opening 12b and extends downward from a side wall of the second casing member 12 at the same side as the first casing member 11. ECU mounting frames 12d extend downward from corners of a bottom wall 12c of the second casing member 12.

The fuse module 20 is attached to the fuse module mounting section 11a while the relay module 30 is attached to the relay module mounting section 12a. The printed board 40 is disposed on an upper surface of the bottom wall 12c of the second casing member 12 while the ECU 13 is attached to the ECU mounting frames 12d on a lower surface of the bottom wall 12c.

A broad bus bar 50, to which a power source line (not shown) is connected, is disposed in a space between the stacked fuse and relay modules 20 and 30 and the printed board 40.

Figure 3:
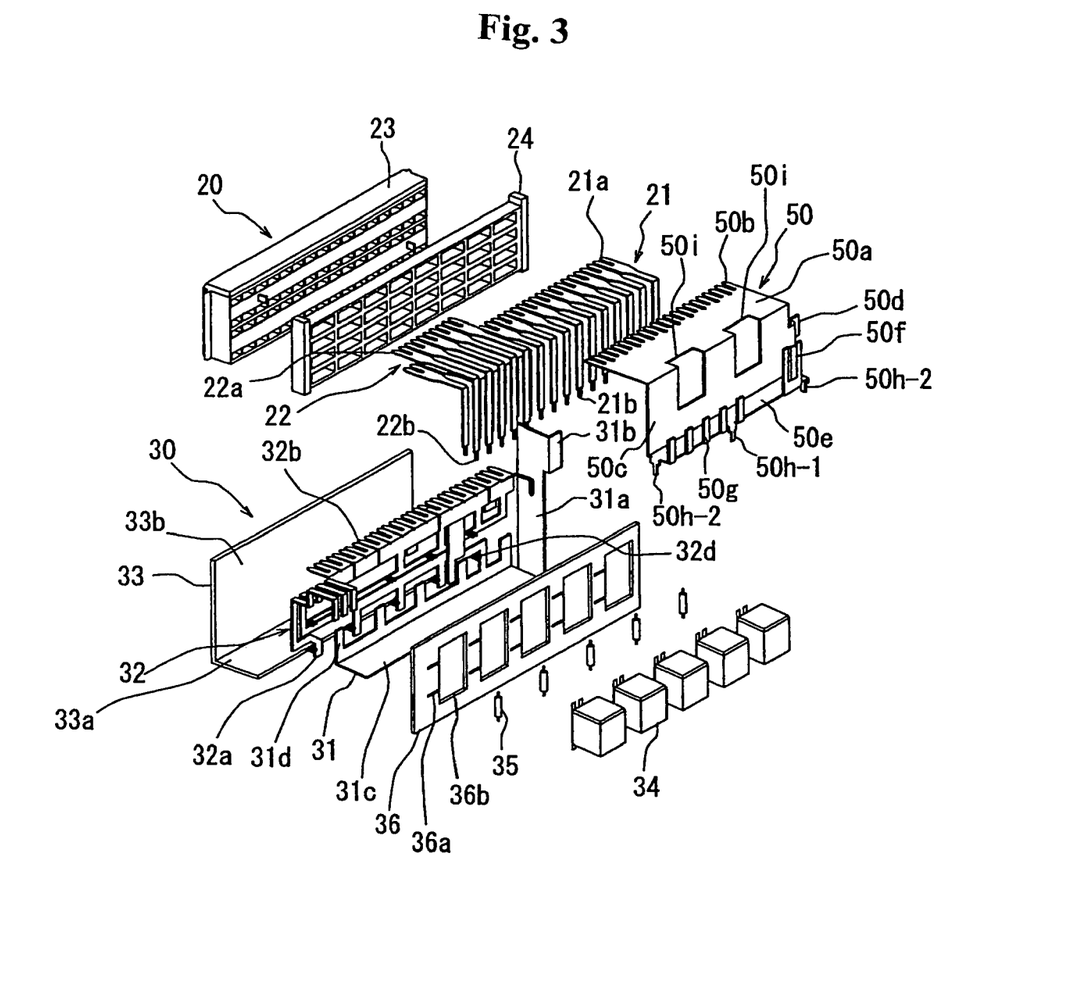
FIG. 3 is an exploded perspective view of a fuse module and relay module.

As shown in FIG. 3, the relay module 30 includes a first bus bar 31 that mainly defines a circuit extending from the broad bus bar 50 to inputs of the relays 34, and a second bus bar 32 that mainly defines a circuit extending from outputs of the relays 34 to inputs of fuses 25 (FIG. 1). The fuse module 20 includes output side connecting terminal members 21 that define a circuit extending from outputs of the fuses 25 to the printed board 40.

Figure 2:
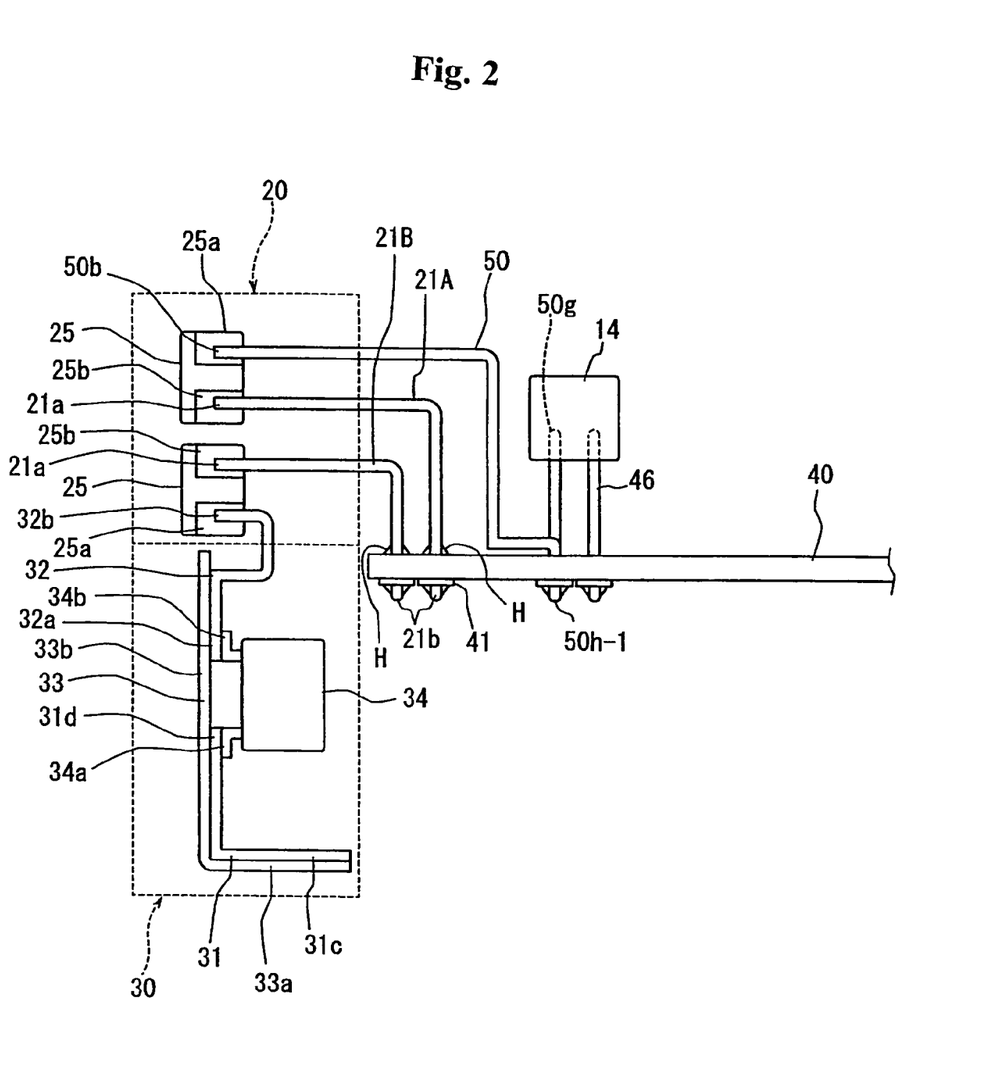
FIG. 2 is a schematic side elevation view of a part of the electrical junction box shown in FIG. 1, illustrating a relationship in arrangement among a fuse module, a relay module, and a printed board.
Figure 4:
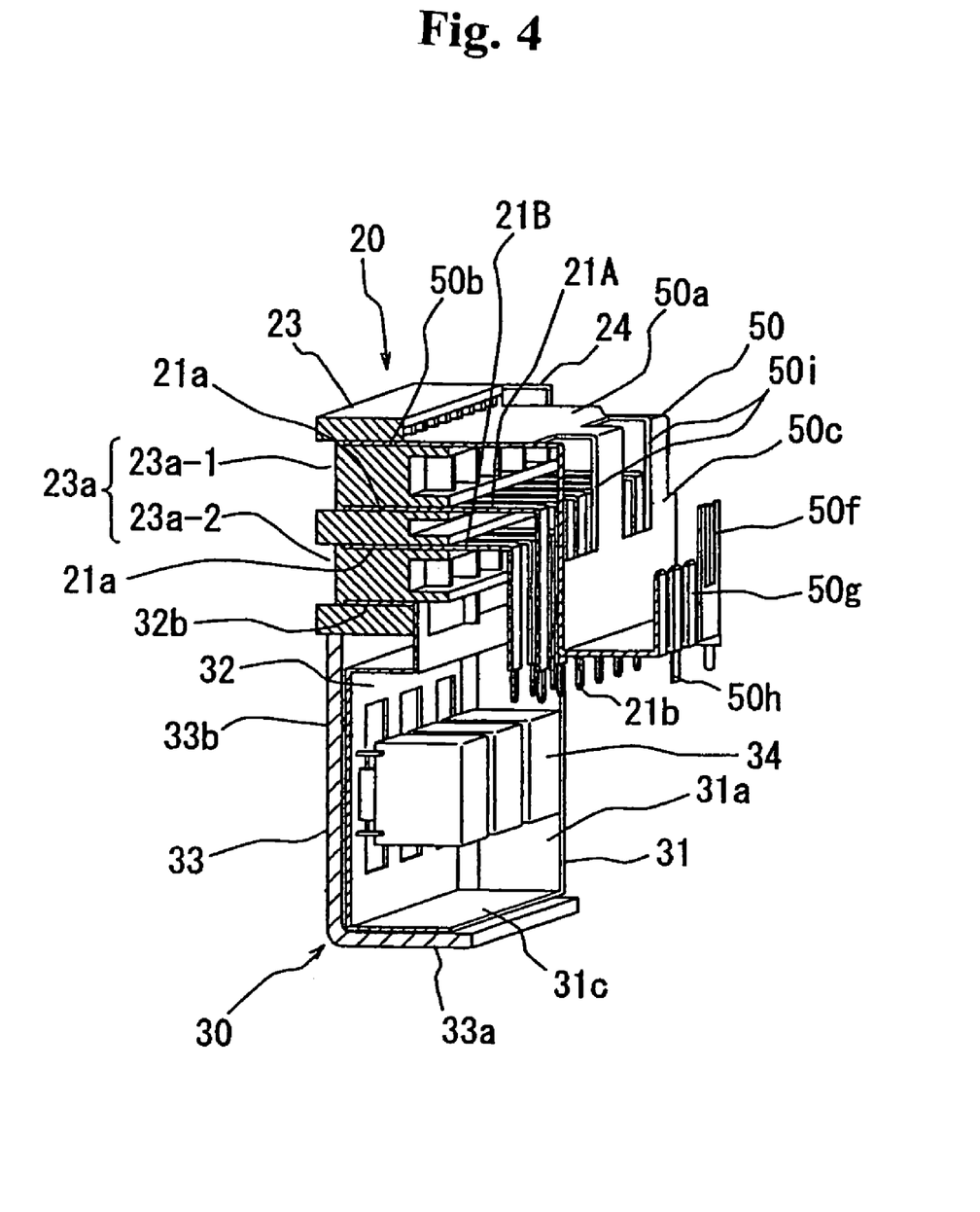
FIG. 4 is a perspective cross section view of a fuse module and relay module, illustrating a position in which the modules are coupled to each other.

A fuse casing 23 that constitutes the fuse module 20 is opposed to the side opening in the fuse module mounting section 11a of the upper casing member 11 and includes fuse-containing sections 23a that are arranged perpendicular to the printed board 40 in two layers in the vertical direction (FIG. 4). A plurality of fuses 25 are mounted on the fuse-containing sections 23a in parallel with one another in a horizontal direction. The fuses 25 mounted on the upper fuse-containing section 23a-1 dispose input terminals 25a in an upper position and output terminals 25b in a lower position (FIG. 2). On the other hand, the fuses 25 mounted on the lower fuse-containing section 23a-2 dispose input terminals 25a in a lower position and output terminals 25b in an upper position (FIG. 2).

The fuse casing 23 is provided on an inner side with a base 24 for a bus bar (FIG. 3) to position the bus bar when the terminal portions of the bus bar are inserted into the fuse-containing sections 23a.

The broad bus bar 50 is formed into an inverted L-shaped configuration in which a horizontal portion 50a extends from an upper end of a vertical portion 50c. The vertical portion 50c is supported on the printed board 40 at a lower end.

A plurality of input side connecting terminals 50b are branched from an outer end edge of the horizontal portion 50a to be connected to the input terminals 25a of the fuses 25. The vertical portion 50c that extends downward from an inner end edge of the horizontal portion 50a is provided on a side with a connecting portion 50d to be connected to the first bus bar 31. The connecting portion 50d is disposed above the printed board 40. The vertical portion 50c is provided on a lower end with a lower end bent portion 50e that extends in an opposite direction from the horizontal portion 50a.

The broad bus bar is provided with rectangular windows 50i that extend from the vertical portion 50c to the horizontal portion 50a. A connected condition of soldered portions H (FIG. 2) between the printed board 40 and the output side connecting terminal members 21 can be seen from the windows 50i, with the broad bus bar 50 being attached to the printed board 40. In this embodiment, two windows 50i are spaced away from each other in a longitudinal direction.

The lower end bent portion 50e of the broad bus bar 50 is provided on an inner end edge with a tab-like power source connecting terminal portion 50f to be connected to a power source terminal (not shown) of a distal end of the power source line and with a plurality of tab-like terminal portions 50g to be connected to input terminals of fusible links 14 (FIG. 2) to be contained in a fusible link containing section 11b in the upper casing member 11. The portions 50f and 50g extend upward from the lower end bent portion 50e.

Pin-like terminal portions 50h extend downward from the lower end bent portion 50e. An intermediate pin-like terminal portion 50h-1 is connected to a conductor 41 of the printed board 40 while opposite pin-like terminal portions 50h-2 are not connected to the conductor 41 but serve as positioning and fixing elements.

The output side connecting terminal members 21 are provided on one end with tuning-fork-like terminal portions 21a to be connected to output terminals 25b of the fuses 25 and are provided on the other end with pin-like terminal portions 21b to be connected to the conductors 41 of the printed board 40. The output side connecting terminal members 21 are formed into an inverted-L-shaped configuration in cross section.

As shown in FIG. 2, the output side connecting terminal members 21 are covered with the broad bus bar 50. In more detail, the output side connecting terminal members 21 are disposed in parallel to the broad bus bar 50 in a space surrounded by the broad bus bar 50, the printed board 40, and the fuse casing 23. Terminal portions 21b of the output side connecting terminal members 21 are soldered to the conductors 41 of the printed board 40. As described above, the soldered portions H between the output side connecting terminal members 21 and the printed board 40 can be seen through the window 50i in the board bus bar 50.

An input side connecting terminal member 22 (FIG. 3) having a length greater than lengths of the output side connecting terminal members 21 is also provided. The input side connecting terminal member 22 is provided on one end with tuning-fork-like terminal portions 22a to be connected to the input terminals 25a of the fuses 25 and on the other end with pin-like terminal portions 22b to be connected to the conductors 41 of the printed board 40. The input side connecting terminal member 22 is formed into an inverted L-shaped configuration in cross section and is arranged in parallel with the broad bus bar 50.

As shown in FIG. 4, the input side connecting terminal portions 50b of the broad bus bar 50 are inserted into the input terminals of some of the fuse-containing sections 23a-1 on the upper layer of the fuse casing 23. The terminal portions 22a of the input side connecting terminal member 22 are inserted into the input terminals of the other fuse-containing sections 23a-1. These terminal portions 50b and 22a are connected to the input terminals 25a of the fuses 25, respectively.

Also, terminal portions 21a of an output side connecting terminal member 21A on an upper layer are inserted into output terminals of the fuse-containing sections 23a-1 on the upper layer. The terminal portions 21a are connected to the output terminals 25b of the fuses 25.

On the other hand, terminal portions 32b of the second bus bars 32 are inserted into the input terminals of the fuse-containing sections 23a-2 on the lower layer in the fuse casing 23 to connect the terminal portions 32b to the input terminals 25a of the fuses 25.

Also, the terminal portions 21a of an output side connecting terminal member 21B on the lower layer are inserted into the output terminals of the fuse-containing sections 23a-2 on the lower layer in the fuse casing 23 to connect the terminal portions 21a to the output terminals 25b of the fuses 25.

Furthermore, the terminal portion 50h-1 of the broad bus bar 50, and the terminal portions 22b on the other end of the input side connecting terminal member 22, which is connected to the terminals of the fuses 25 at an end, are soldered to the conductors 41 of the printed board 40.

In addition, a power source connecting terminal portion 50f of the broad bus bar 50 projects into a connector containing section 11c of the upper casing member 11. The power source connecting terminal portion 50f is connected to a power source terminal (not shown) on the distal end of the power source line to be connected through a connector to the connector containing section 11c.

Further, the terminal portions 50g of the broad bus bar 50 project in the fusible link containing section 11b of the upper casing member 11. The terminal portions 50g are connected to input terminals of fusible links 14 accommodated in the fusible link containing section 11b.

The first bus bar 31 is formed into a substantially L-shaped configuration in cross section and includes a vertical portion 31a and a power source connecting portion 31b provided on an upper end of the vertical portion 31a. The power source connecting portion 31b is welded to the connecting portion 50d of the broad bus bar 50. The vertical portion 31a of the first bus bar 31 is disposed in a space enclosed by the upper horizontal portion 50a and vertical portion 50c of the broad bus bar 50. Tab-like terminal portions 31d to be connected to input terminals 34a of the relays 34 extend upward and are spaced away from one another along the outer end edge of the horizontal portion 31c extending from the lower end of the vertical portion 31a.

A bottom surface of the horizontal portion 31c of the first bus bar 31 is adhered through an insulative adhesive to a lower end horizontal surface 33a of a heat radiation plate 33, made of aluminum, for example, and having an L-shaped configuration in cross section. A vertical portion 33b extends upward from an outer end edge of the lower end horizontal surface 33a of the heat radiation plate 33 and is opposed to the opening 12b in the side wall of the lower casing member 12. The terminal portion 31d of the first bus bar 31 is adhered through an insulative adhesion to an inner surface of the vertical portion 33b.

The second bus bars 32 are disposed in a vertical direction and adhered through an insulative adhesion to an inner surface of the vertical portion 33b of the heat radiation plate 33. The second bus bars 32 are provided on lower ends with tab-like terminal portions 32a to be connected to output terminals 34b of the relays 34 and are provided on upper ends with tuning-fork-like terminal portions 32b to be connected to input terminals 25a of the fuses 25.

The second bus bars 32 are provided with a plurality of press-contact tabs 32d to be connected to terminals of resistors 35. The press-contact tabs 32d are inserted into terminal holes 36a in a sheet of insulation plate 36, respectively. A plurality of second bus bars 32 are positioned by the insulation plate 36. The insulation plate 36 is provided with a plurality of rectangular openings 36b spaced away from one another in a longitudinal direction (horizontal direction). An input terminal 34a of each relay 34 is soldered through the opening 36b to the terminal portion 31d of the first bus bar 31. An output terminal 34b of each relay 34 is soldered to the terminal portion 32a of each second bus bar 32. These relays 34 are directed laterally and disposed toward the interior of the casing.

Connectors 44A and 44B (FIG. 1) that hold a plurality of connector connecting terminals 42 through bases 43 for terminals are mounted on top and bottom surfaces of the printed board 40. Ends of the connector connecting terminals 42 are soldered to the conductors 41 of the printed board 40. The other ends of the connector connecting terminals 42 project in the connector containing sections 11d and 12e provided in the lower casing member 12 and upper casing member 11, respectively. The conductors 41 of the printed board 40 are connected to an external circuit through the connectors 44A mounted on the top surface of the printed board 40 and are connected to the ECU 13 through the connectors 44B mounted on the bottom surface of the printed board 40.

Relays 45 and terminal members 46 are mounted on the top surface of the printed board 40. Ends of the terminal members 46 are soldered to the conductors 41 of the printed board 40. The other ends of the terminal members 46 project in the fusible link connecting section 11b of the upper casing member 11 so as to be connected to output terminals of the fusible links 14.

The relays 45 to be mounted on the printed board 40 may be relays for electrical devices such as a power window and the like that operate intermittently. The relays 34 of the relay module 30 are relays for electrical devices such as a radio set and the like that operate continuously for a long period of time.

Next, a circuit including the fuse module 20, the relay module 30, and the printed board 40 will be explained below.

A first power source circuit interposing the relays 34 of the relay module 30 and the fuses 25 of the fuse module 20 comprises the broad bus bar 50, the first bus bar 31, the relays 34, the second bus bars 32, the fuses 25, the output side connecting terminal member 21B, and the conductors 41 of the printed board 40. The first power source circuit is connected through the connectors 44A to an external circuit.

A second power source circuit interposing only the fuses 25 of the fuse module 20 comprises the broad bus bar 50, the fuses 25, the output side connecting terminal member 21A, and the conductors 41 of the printed board 40. The second power source circuit is connected through the connectors 44A to an external circuit.

A third power source circuit not interposing the relays 34 of the relay module 30 and the fuses 25 of the fuse module 20 comprises the broad bus bar 50, the fusible links 14, the terminal members 46, and the conductors 41 of the printed board 40. The third power source circuit is connected through the connectors 44A to an external circuit.

Although these circuits interpose the relays 45, other electrical devices (not shown) mounted on the printed board 40, and the ECU 13, if necessary, explanations of the circuits are omitted here.

A circuit including the input side connecting terminal member 22 to be connected to the input terminals 25a of the fuses 25 comprises the conductors 41 of the printed board 40, the input side connecting terminal member 22, the fuses 25, the output side connecting terminal member 21A, and the conductors 41 of the printed board 40.

In the electrical junction box for a motor vehicle constructed as described above, because the windows 50i are provided in the broad bus bar 50, it is possible to see the connected condition of the soldered portions H between the printed board 40 and the output side connecting terminal members 21, even if the output side connecting terminal members 21 soldered to the printed board 40 are covered with the broad bus bar 50. Thus, the electrical junction box is not shipped without detecting a failure in the soldered output side connecting terminal members 21. This will enhance reliability of the soldered connections.

Furthermore, because a step of inspecting the soldered connection by using an inspection device is eliminated, any inspection equipment is not required and the number of working steps can be reduced, thereby suppressing production costs.

Also, because the windows 50i extend from the vertical portion 50c of the broad bus bar 50 to the horizontal portion 50a and the plural windows 50i are spaced away from one another in the longitudinal direction, it is possible to widen a visual area of the soldered portions H on the output side connecting terminal members 21 connected to the printed board 40. Therefore, it is possible to reliably detect a failure in the soldered connection between the printed board 40 and the output side connecting terminal members 21 and to decrease failed conditions.

Furthermore, because the lower end bent portion 50e is provided on the broad bus bar 50 to be connected to the input terminals of the fusible links 14, the fusible links 14 can be directly connected to the broad bus bar 50. Thus, it is possible to eliminate any connecting terminal for coupling the broad bus bar 50 and fusible links 14 to each other and to reduce the number of parts.

The embodiments described above are intended to be illustrative and not limiting. Various modifications, substitutes and/or improvements are possible within the spirit and scope of the invention.

What is claimed is:

1. An electrical junction box comprising:

a printed board;

a broad bus bar for a power source circuit;

a plurality of output side connecting terminal members; and a casing for containing the printed board, broad bus bar, and terminal members;

wherein fuse-containing sections are disposed on a side of the casing in a direction perpendicular to the printed board, a plurality of fuses are mounted on the fuse-containing section in parallel with one another, and an input terminal of each fuse is disposed on a first side and an output terminal of each fuse is disposed on a second side, wherein the broad bus bar for the power source circuit has a vertical portion and a horizontal portion extending from an upper end of the vertical portion to form an inverted L-shaped configuration, a lower end of the vertical portion is supported on the printed board, and a distal end of the horizontal portion is provided with a plurality of branched input side connecting terminal portions to be connected to the input terminals of the fuses, wherein the output side connecting terminal members are disposed in a space covered with the broad bus bar, are connected to output terminals of the fuses, and are soldered to conductors of the printed board at lower ends of the output side connecting terminal members, and wherein the broad bus bar is provided with a window so that a soldered condition of the output side connecting terminal members can be seen through the window.

2. The electrical junction box according to claim 1, wherein the broad bus bar is provided with a plurality of windows that extend from the vertical portion of the broad bus bar to the horizontal portion and are spaced away from one another in a longitudinal direction.

3. An electrical junction box comprising:

a printed board;

a broad bus bar for a power source circuit;

a plurality of output side connecting terminal members; and a casing for containing the printed board, broad bus bar, and terminal members, wherein the broad bus bar has a vertical portion and a horizontal portion extending from an upper end of the vertical portion to form an inverted L-shaped configuration, and wherein the broad bus bar is provided with a plurality of windows that extend from the vertical portion of the broad bus bar to the horizontal portion and are spaced away from one another in a longitudinal direction so that a soldered condition of the output side connecting terminal members can be seen through the windows.

4. The electrical junction box according to claim 3, wherein fuse-containing sections are disposed on a side of the casing in a direction perpendicular to the printed board, a plurality of fuses are mounted on the fuse-containing section in parallel with one another, and an input terminal of each fuse is disposed on a first side and an output terminal of each fuse is disposed on a second side.

5. The electrical junction box according to claim 3, wherein a lower end of the vertical portion of the broad bus bar is supported on the printed board, and a distal end of the horizontal portion is provided with a plurality of branched input side connecting terminal portions to be connected to input terminals of the fuses.

6. The electrical junction box according to claim 3, wherein the output side connecting terminal members are disposed in a space covered with the broad bus bar, are connected to output terminals of the fuses, and are soldered to conductors of the printed board at lower ends of the output side connecting terminal members.

* * * * *